United States Patent
Agrawal et al.

(10) Patent No.: US 6,366,508 B1
(45) Date of Patent: Apr. 2, 2002

(54) INTEGRATED CIRCUIT MEMORY HAVING COLUMN REDUNDANCY WITH NO TIMING PENALTY

(75) Inventors: Ghasi R. Agrawal, San Jose; Jerry K. Tanaka, Los Altos, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/729,020

(22) Filed: Dec. 4, 2000

(51) Int. Cl.$^7$ ................................................. G11C 7/00
(52) U.S. Cl. .................. 365/200; 365/201; 365/230.02; 365/189.02
(58) Field of Search ................................ 365/200, 201, 365/230.06, 230.02, 189.02

(56) References Cited

U.S. PATENT DOCUMENTS 4,471,472 A * 9/1984 Young ........................ 365/200
5,953,745 A * 9/1999 Lattimore et al. ...... 365/200 X

* cited by examiner

Primary Examiner—Huan Hoang
(74) Attorney, Agent, or Firm—Westman, Champlin & Kelly (57) ABSTRACT

A memory array includes a zone of memory elements and a column multiplexer. The zone of memory elements is arranged in rows and columns, including a set of non-redundant columns and a redundant column. The column multiplexer has a section coupled to the set of non-redundant columns and to the redundant column. The column multiplexer has a selectable non-redundant path through the section for each of the non-redundant columns and a selectable redundant path for the redundant column. The redundant path is interchangeable with any one of the non-redundant paths.

15 Claims, 4 Drawing Sheets

INTEGRATED CIRCUIT MEMORY HAVING COLUMN REDUNDANCY WITH NO TIMING PENALTY

CROSS-REFERENCE TO RELATED APPLICATION

Cross-reference is made to U.S. application Ser. No. 09/727,043, which is entitled "INTEGRATED CIRCUIT MEMORY HAVING COLUMN REDUNDANCY" and was filed Nov. 30, 2000.

BACKGROUND OF THE INVENTION

The present invention relates generally to integrated circuit memory devices. More particularly, the present invention relates to memories with redundancy.

Semiconductor integrated circuit memories such as static random access memories ("SRAMs") have used built-in self repair ("BISR") circuits to screen for and sometimes repair certain memory failures in the factory and in the field. BISR circuits typically include a state machine, which is fabricated on the integrated circuit with the memory array for implementing a selected test algorithm. This algorithm is initiated in the factory by an external memory tester. In the field, the algorithm is initiated on start-up.

The prevailing method for detecting faults in SRAMs that have BISR circuits is to screen for these faults in the factory. In the factory, the memory and associated BISR circuit are coupled to a memory tester, which provides a supply voltage and a system clock to the memory array and provides control signals to operate the BISR circuit. Typically, memory testers use a two-pass approach through the BISR circuit test algorithm. In the first pass, memory failures are detected and repaired. In the second pass, the repairs are verified.

A common BISR test algorithm consists of several runs through the memory array. The BISR test algorithm performs a sequence of writes and reads on each cell in the memory array, comparing the output of each read with expected data. When a discrepancy is detected, the BISR test algorithm re-maps the memory addresses to replace the row containing the failing cell with a redundant row. These repairs are verified in the second pass through the BISR test algorithm. If all errors in at least some of the failing memories can be repaired by using available redundant rows, then the overall manufacturing yield for the memory devices can be increased, which reduces manufacturing costs.

When the memory is installed in the field, the BISR test algorithm is initiated on start-up. Then, during normal operation of the memory array, typical existing systems employ an address matching circuit connected to the input addresses. Incoming addresses are compared against pre-programmed failing addresses on every access cycle. If the incoming address matches a failing address, a redundant memory element is utilized in place of the target memory element. The comparison has a significant timing impact on the system. The more address bits there are, the longer it takes to perform the comparison. Currently, a 10-bit address can take 2 ns (nanoseconds) or more to be matched.

A memory device is therefore desired that has redundancy with little or no timing penalty associated with avoiding faulty memory cells and which results in further increasing manufacturing yield as compared to existing redundancy schemes.

SUMMARY OF THE INVENTION

One embodiment of the present-invention is directed to a memory array, which includes a zone of memory elements and a column multiplexer. The zone of memory elements is arranged in rows and columns, including a set of non-redundant columns and a redundant column. The column multiplexer has a section coupled to the set of non-redundant columns and to the redundant column. The column multiplexer has a selectable non-redundant path through the section for each of the non-redundant columns and a selectable redundant path for the redundant column. The redundant path is interchangeable with any one of the non-redundant paths.

Another embodiment of the present invention is directed to a memory system for replacing defective memory elements. The memory system includes a memory array and a column multiplexer. The memory array includes a zone of memory elements arranged in rows and columns, including a set of non-redundant columns and a redundant column. The column multiplexer has a section for multiplexing the set of non-redundant columns into a data node and for selectively interchanging the redundant column for any one of the non-redundant columns in the set.

Another embodiment of the present invention is directed to a method of repairing a memory array. The memory array has a zone of memory elements and a column multiplexer. The zone of memory elements is arranged in rows and columns, including a set of non-redundant columns. The column multiplexer has a non-redundant path from each non-redundant column to a data node, which is selectable through a corresponding column select line. The method of repairing includes: providing a redundant column of memory elements in the zone and a redundant path from the redundant column to the data node through the column multiplexer; identifying one of the non-redundant columns as a defective column; and re-directing the column select line that corresponds to the non-redundant path for the defective column from the corresponding non-redundant path to the redundant path.

DETAILED DESCRIPTION OF ILLUSTRATIVE EMBODIMENTS

Figure 1:
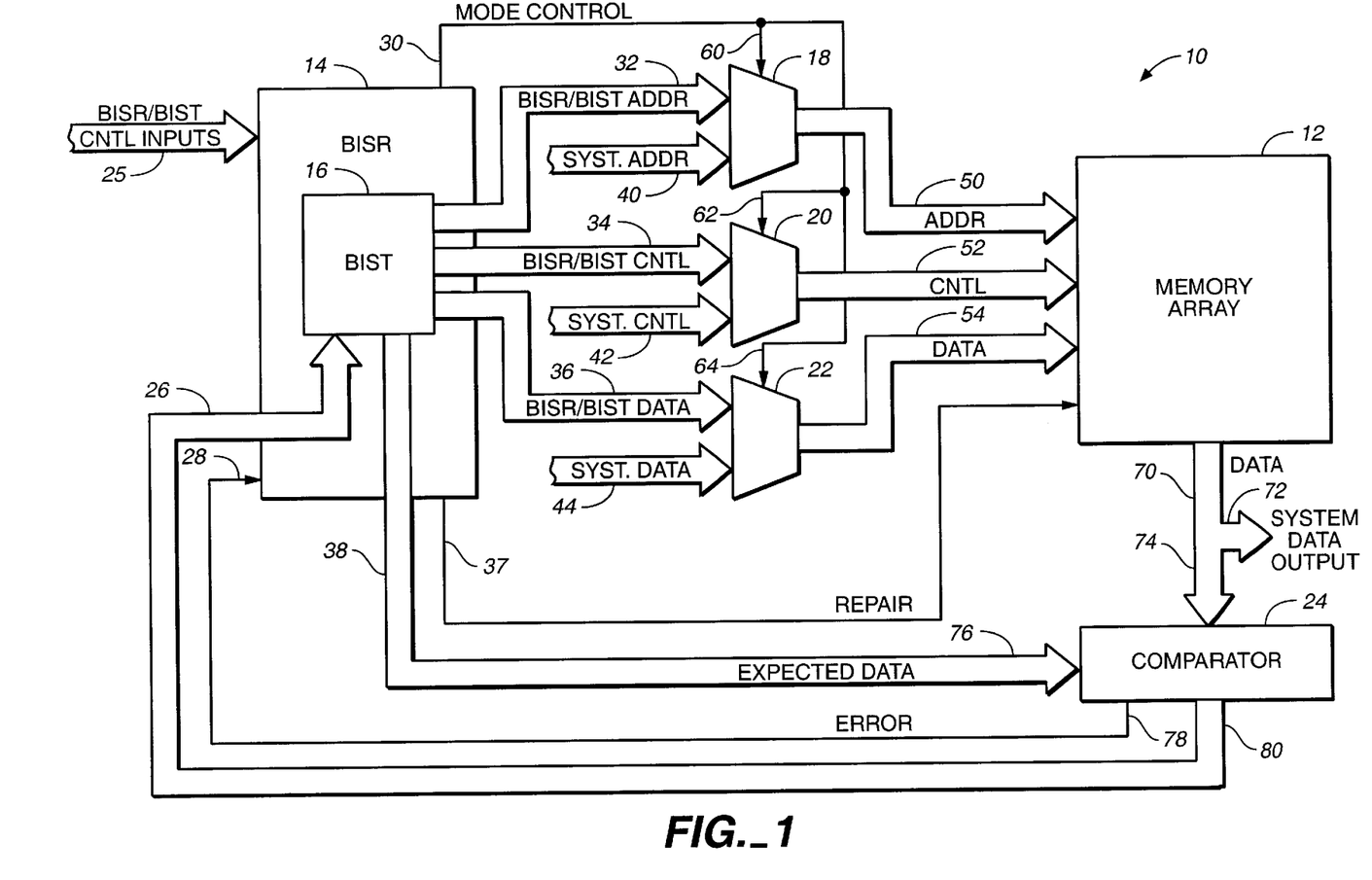
FIG. 1 is a block diagram of an integrated circuit memory having a built-in self repair (BISR) circuit according to an illustrative embodiment of the present invention.

FIG. 1 is a block diagram of an integrated circuit 10 having a memory array 12 and a built-in self repair (BISR) circuit 14, according to one embodiment of the present invention. Memory array 12 can include a static random access memory (SRAM), for example, or any other type of memory in which column redundancy is useful. BISR circuit 14 includes a built-in-self-test (BIST) circuit 16 and surrounding support circuitry for testing and potentially repairing memory array 12. This support circuitry includes multiplexers 18, 20 and 22, comparator 24 and, circuitry internal to memory array 12. In one embodiment, BIST circuit 16 is adapted to test the memory elements within memory array 12 and identify any columns in memory array 12 in which a failure has occurred. BISR circuit 14 then attempts to repair the defect by replacing the defective column or columns with a redundant column or columns through the column multiplexer, as described in more detail below.

BISR circuit 14 includes control inputs 25, comparison inputs 26, error input 28, test/repair mode control output 30, address output 32, control output 34, data output 36, repair control output 37 and expected data output 38. Individual inputs and outputs of BISR circuit 14 can be received or driven by either BISR circuit 14 or BIST circuit 16, depending on the particular implementation of the circuits and the test and repair algorithm implemented by the circuits. Also, these inputs and outputs can be received or driven by different elements during different stages of the algorithm.

Address output 32, control output 34 and data output 36 are coupled to the first of two data inputs of multiplexers 18, 20 and 22, respectively. When BIST circuit 16 is enabled and in a test mode, these outputs provide the address, control and data signals for testing memory array 12. Repair control output 37 is coupled directly to memory array 12 for controlling repairs within the memory array. The second data inputs of multiplexers 18, 20 and 22 are coupled to system address input 40, system control input 42 and system data input 44, which provide the address, control and data to memory array 12 during normal operation. These inputs are driven by input pins of integrated circuit 10 or other circuitry (not shown) on integrated circuit 10. The outputs of multiplexers 18, 20 and 22 are coupled to address input 50, control input 52 and data input 54, respectively, of memory array 12. BISR circuit 14 controls which of the address, data and control signals are applied to memory array 12 through the test/repair mode control output 30, which is coupled to select inputs 60, 62 and 64 of multiplexers 18, 20 and 22.

Memory array 12 has a data output 70, which is coupled to system output 72 and to a first comparison input 74 of comparator 24. A second comparison input 76 of comparator 24 is coupled to expected data output 38 of BISR circuit 14, which is provided by BIST circuit 16. Comparator 24 has an error output 78, which is coupled to error input 28 of BISR circuit 14. Error output 78 indicates whether there is an error in any one of the data bits received from memory array 12 as compared to the expected data bits received from BIST circuit 16. Comparator 24 further includes individual comparison outputs 80, which reflect bit-by-bit comparisons between the data received from memory array 12 and the expected data received from BIST circuit 16. Comparison outputs 80 assist BIST circuit 16 in determining which, if any, of the columns in memory array 12 contain a defect. Comparison outputs 80 are coupled to input 26 of BISR circuit 14, which is provided to BIST circuit 16.

As mentioned above, multiplexers 18, 20 and 22 control whether memory array 12 is operated by external system circuitry or by BISR circuit 14 and BIST circuit 16. During normal operation, BISR circuit 14 and BIST circuit 16 are inactive, and BISR circuit 14 controls multiplexers 18, 20 and 22 to couple system address input 40, system control input 42 and system data input 44 to memory array 12 for accessing selected memory locations.

In the test mode, BISR circuit 16 controls multiplexers 18, 20 and 22 to couple address output 32, control output 34 and data output 36 to memory array 12. BIST circuit 16 controls outputs 32, 34 and 36 to perform a sequence of writes and reads on memory array 12. The test algorithm sequences through each address location of memory array 12 and performs several write and read operations at each location. For example, the test algorithm can initially write a test pattern to memory array 12, such that each memory cell as a definite state. The test algorithm then reads the stored data (i.e., logic state) from each memory cell, writes the opposite state to the memory cell and then reads the stored, opposite state from the memory cell.

As each cell or address location is read, comparator 24 compares the data that was read with expected data provided by BIST circuit 16 on output 38. If the data that was read from memory array 12 does not match the expected data, comparator 24 activates error output 78. Individual comparison outputs 80 indicate the particular data bit containing the error. This can be used by BIST circuit 16 to identify the corresponding column in memory array 12 causing the error. When error output 78 is active, BIST circuit 16 logs the error and the states of individual comparison outputs 80. The test algorithm then moves on to the next cell or address location in the array. The test algorithm can run through the addressed locations in memory array 12 multiple times and in various orders, with multiple test patterns being written to and read from the array. This type of test algorithm is commonly referred to as a march-type test algorithm.

BIST circuit 16 can include a state machine or finite controlled system, for example, which implements a built-in self test algorithm for testing each cell of memory array 12. In one embodiment, BIST circuit 16 includes a finite controlled system similar to the commercially available RAM BISTs provided by LSI Logic Corporation of Milpitas, Calif. or LogicVision, Inc, of San Jose, Calif., for example. Other circuits either hard-wired or driven by software can be used to implement a desired test algorithm.

When memory array 12 contains a faulty memory location, BIST circuit 16 activates the repair function within BISR circuit 14. The faulty memory locations can be repaired as faults are detected or after all memory locations have been tested by BIST circuit 16. As explained in more detail below, BISR circuit 14 attempts repairs on the faulty memory locations by selectively replacing defective columns with redundant columns within memory array 12 by re-directing column select lines within the column multiplexer. In one embodiment, the repair circuitry for re-directing the column select lines within memory array 12 is accessed through the same address, control and data outputs used by BIST circuit 16 and through repair control output 37. In another embodiment (not shown), the repair circuitry is accessed through separate signals passed directly to memory array 12.

Figure 2:
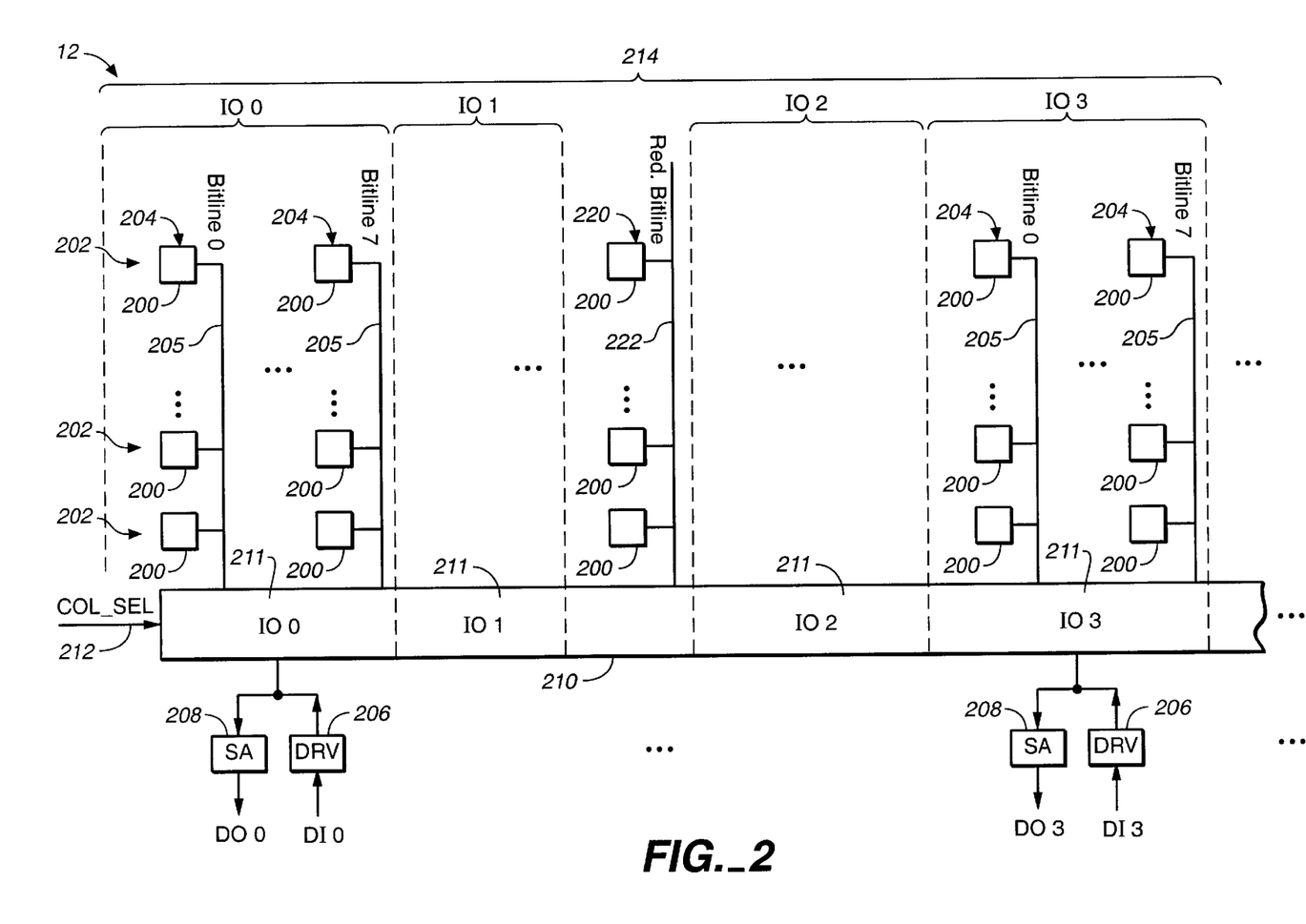
FIG. 2 is a fragmentary, schematic diagram which illustrates the rows and columns within the memory in greater detail.

FIG. 2 is a schematic diagram which illustrates the rows and columns within memory array 12 in greater detail. Memory array 12 includes a plurality of memory elements 200, which are arranged in a plurality of rows 202 and non-redundant columns 204. In one embodiment, memory array 12 has 128 physical rows 202 and 1024 physical columns 204. However, any number of rows and columns can be used in alternative embodiments. The memory elements 200 in each column 204 are coupled to a respective bitline 205. For simplicity, only one bitline 205 for each column 204 is shown in FIG. 2. However, multiple bitlines can be used for each column, such as a pair of complementary bitlines.

Memory 12 has a column multiplexer 210, for multiplexing groups of bitlines 205 into a respective data input-output bit. In the embodiment shown in FIG. 2, column multiplexer 210 is configured as an 8:1 multiplexer. However, other configurations can also be used such as 4:1, 16:1 and 32:1 configurations. With an 8:1 multiplexer configuration and 1024 physical columns, there are 128 data inputs, "labeled DI0–DI127", and 128 data outputs, labeled "DO0–DO127". For simplicity, only DI0, DI3, DO0 and DO3 are shown in FIG. 2. Each data input is coupled to a respective bitline driver 206, and each data output is coupled to a respective sense amplifier 208. Each bitline driver and sense amplifier pair is coupled to a respective data input-output node "IO0–IO127" (IO4–IO127 not shown) of column multiplexer 210. Each data input-output node can include a single, bidirectional node or a separate input node for writing and a separate output node for reading, depending on the particular implementation of the column multiplexer.

With an 8:1 column multiplexer, bitlines 205 are grouped in sets of eight, with each set being labeled IO0–IO127 (IO4–IO127 not shown) to correspond to the respective data input-output node of column multiplexer 210. Within each set, bitlines 205 are labeled "bitline 0" to "bitline 7". For each set of bitlines, a respective section 211 of column multiplexer 210 couples a selected one of the bitlines 0–7 to the respective bitline driver 206 and sense amplifier 208, as a function of one or more column select inputs, Col_Sel, provided on select input 212.

To support the repair function of BISR circuit 14 (shown in FIG. 1) memory array 12 further includes one or more redundant columns 220 of memory elements 200. Each redundant column 220 has a respective redundant bitline 222, which is coupled to column multiplexer 210. BISR circuit 14 can repair either one or more defects per zone, with a zone being defined as a selected number, N, of physical columns. In the embodiment shown in FIG. 2, there are 32 zones 214, with each zone having 32 physical columns 205 and one redundant column 220. The number of physical columns in each zone (and thus the total number of redundant columns in the memory) can be set based on the yield requirements of memory array 12 and the acceptable area penalty that can be occurred through the introduction of redundant columns. Redundant column 220 can be positioned anywhere within zone 214, such as in the center of the zone as shown in FIG. 2. Redundant column 220 is interchangeable with any one of the non-redundant columns 204 in zone 214. In the event that one of the non-redundant columns 204 contains a memory element that is defective, BISR circuit 14 replaces the defective column by redirecting the respective column select line within column multiplexer 210 from the defective column 204 to the redundant column 220.

Figure 3:
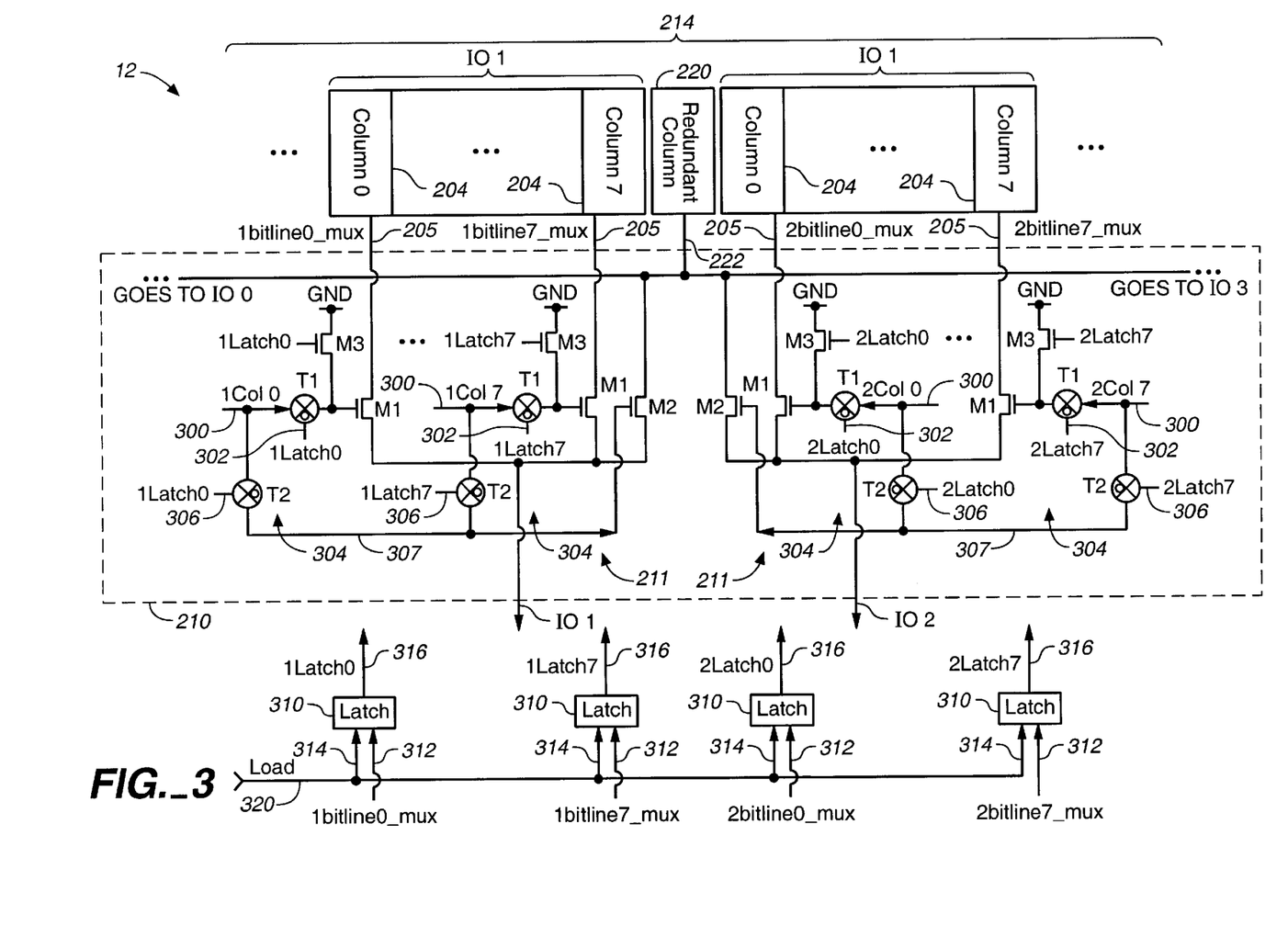
FIG. 3 is a fragmentary, schematic diagram which illustrates re-directing of column select lines within the memory in greater detail.

FIG. 3 is a schematic diagram which illustrates the re-direction of column select lines within column multiplexer 210 in greater detail. For simplicity, the selection circuitry for only IO1 and IO2 is shown. Column multiplexer 210 includes a multiplexer section 211 for each of the data input-output nodes IO0–IO127 (IO0 and IO3–IO127 not shown). Each section 211 includes a column select switch M1 for each physical column 204 in that section. Each column select switch M1 is coupled in series between a respective bitline 205 and the corresponding data input-output node for that section 211. For example in IO1, column select switches M1 are coupled in series between columns 0–7 and data input-output node IO1. In IO2, column select switches M1 are coupled in series between columns 0–7 and data input-output node IO2. The column select switches M1 therefore provide electrical conduction paths from each non-redundant column 204 to the corresponding data input-output node.

Each column select switch M1 has a control terminal coupled to a respective column select line 300. For simplicity, the decoding circuitry for the column select lines 300 is not shown in FIG. 3. In IO1, the control terminals of switches M1 for columns 0 to 7 are coupled to the column select lines labeled "1Col0" to "1Col7", respectively. In IO2, the control terminals of column select switches M1 for columns 0 to 7 are coupled to the column select lines labeled "2Col0" to "2Col7", respectively. During normal operation, for each read and write operation, column multiplexer 210 activates one of the column select lines 300 in each multiplexer section 211 to couple the selected column 204 in each section to its respective sense amplifier and bitline driver pair (shown in FIG. 2). Each switch M1 can include a single switch or separate switches for reading and writing in different embodiments of the present invention.

Column multiplexer 210 further includes a redundant column select switch M2 for each multiplexer section 211 and IO, which selectively couples the redundant bitline 222 to the data input-output node IO0–IO127 for that section 211. For example in IO1, there is one column select switch M2 coupled between redundant bitline 222 and data input-output node IO1. In IO2, there is one redundant column select switch M2 coupled between redundant bitline 222 and data input-output node IO2. Redundant column select switches M2 provide parallel, redundant paths through multiplexer 210.

In order to support the repair function, column multiplexer 210 further includes a column access steering circuit 304 for each column 204 of memory array 12. Each steering circuit 304 includes transmission gates (or switches) T1 and T2 and a grounding switch M3. Each transmission gate T1 is coupled in series between the control terminal of the respective column, select switch M1 and the respective column select line 300 for selectively coupling and decoupling the column select line. Each transmission gate T1 has an inverting control terminal 302, which is coupled to a respective control signal. For example in IO1, control terminals 302 are coupled to control signals 1Latch0 to 1Latch7, respectively. In IO2, control terminals 302 for columns 0–7 are coupled to latch control signals 2Latch0 to 2Latch7. The control terminals 302 of the remaining transmission gates T1 are coupled to a respective control signal in a similar fashion.

Within each multiplexer section 211, transmission gates T2 are coupled in series between respective column select lines 300 and the control terminal of the redundant column select switch M2 in that section. Transmission gates T2 selectively re-direct column select lines 300 to the redundant column select switch M2. Each transmission gate T2 has a non-inverting control terminal 306, which is coupled to a respective control signal. For example, in IO1, control terminals 306 corresponding to columns 0–7 are coupled to control signals 1Latch0 to 1Latch7, respectively. In IO2, control terminals 306 for columns 0–7 are coupled to latch control signals 2Latch0 to 2Latch7.

Each grounding switch M3 is coupled between the control terminal of a respective column select switch M1 and voltage reference terminal GND. The control terminals of grounding switches M3 are also coupled to respective control signals. For example in IO1, the control terminals of grounding switches M3 for columns 0–7 are coupled to control signals 1Latch0 to 1Latch7, respectively. In IO2, the control terminals of grounding switches M3 for columns 0–7 are coupled to control signals 2Latch0 to 2Latch7, respectively.

The control signals operating each column access steering circuit 304 are generated by respective latches 310. There is one latch 310 for each physical column 204 (and respective steering circuit 304) in memory array 12. Each latch 310 has a data input 312, a load control input 314 and a data output 316. Each data output 316 is coupled to the control terminals of the grounding switch M3 and transmission gates T1 and T2 of the corresponding steering circuit 304. The load control input 314 of each latch 310 is coupled to load input 320. In one embodiment, load input 320 is coupled to repair control output 37 (shown in FIG. 1) of BISR circuit 14.

Depending on the logic state stored in each latch 310 one of the corresponding transmission gates T1 or T2 will be in an "on" state and the other will be in an "off" state. During initial operation, each latch 310 is reset to a "zero" state. Each transmission gate T1 is "on" and couples the respective column select line 300 to the control terminal of its respective column select switch M1. Each grounding switch M3 is off. Each transmission gate T2 is off and decouples the column select lines 300 from the control terminal of the respective redundant column select switch M2. Column multiplexer 210 operates normally to direct the selected bitlines 205 to the respective data input-output nodes IO1–IO127.

If a defect is detected within one of the columns 204 of zone 214 by BIST circuit 16, BISR circuit 14 activates load control input 320 and loads the latch 310 that corresponds to the defective column with a logic "one". The remaining latches 310 of zone 214 remain loaded with a logic "zero". This re-directs the column select line 300 from the column select switch M1 of the defective column to the redundant column select switch M2 for the respective IO. For example, if a defect occurs in column 0 of IO1, BISR circuit 14 loads the latch 310 that corresponds to column 0 of IO1 with a "one" and loads the remaining latches 310 of zone 214 with a "zero". Transmission gate T1 for column 0 of IO1 turns off, and transmission gate T2 for column 0 of IO1 turns on. This redirects the column select line 300 that is labeled "1Col0" from the control terminal of the respective column select switch M1 to the control terminal of the redundant column select switch M2 of IO1. The remaining column select lines 300 remain coupled to their respective column select switches M1. Grounding switch M3 for column 0 of IO1 is closed, which ensures that the column select switch M1 for column 0 remains off. Once all latches 310 in memory array 12 are loaded with the appropriate state, redundant column 220 effectively replaces the defective column for all subsequent read and write operations with no extra decoding of the column address.

In the embodiment shown in FIG. 3, each latch data input 312 is coupled to the bitline 205 of the corresponding physical column 204. For example, data input 312 of the latch 310 for column 0 of IO1 is coupled to the bitline 205 that is labeled "1bitline0_mux". Once BIST circuit 16 has identified a column having a defective memory cell, BISR circuit 14 can load latches 310 with the desired states through data inputs DI0–DI127 and column multiplexer 210. Separate addressing circuitry for latches 310 is not required. With a 8:1 column multiplexer, only eight writing operations are required for setting the states of all the latches 310 so that the defective column can be replaced.

For each failure identified by BIST circuit 16, BISR circuit 14 converts the bit map failure information into a coded digital value having an IO address field, a column address field and a zone defect field indicating whether there is a defect in that particular zone. For example, if there is a failure on IO2, with four IO's per zone, the corresponding binary IO address would be "10". If the memory array contains more than one word per row, then BISR circuit 14 stores the corresponding column address. For example, in a case of an 8:1 column multiplexer, memory array 12 would have eight words per row, and the failure can be located in any of the eight columns of a word. If the failure occurred in column 0 of IO2 (IO "10"), the corresponding binary column address would be "000".

The IO addresses can be coded per zone 214 or can be coded for the whole memory array 12. By coding IO addresses per zone, only one failure per zone needs to be coded. If the IO addresses are coded in terms of the whole memory, then there may be more than one failure and all failures would need to be coded. All columns in the memory array would need to be addressed uniquely and this would add to the coding complexity. For example, an IO address for a memory having a maximum of 1024 physical columns would need 10 address bits. If the memory has an 8:1 column multiplexer, then three address bits would be needed to identify which of the eight columns had a failure, and seven bits would be needed to identify which of the 128 IOs contained the failure. An additional difficulty in coding IO addresses in terms of the whole memory is that the number of address bits for identifying the column and the IO containing a failure would be dependent on the particular column multiplexer option selected for that memory, which can vary from one application to the next. The total number of address bits would remain the same at 10.

Table 1 shows the number of IO and column address bits required for various column multiplexer options for a memory having a maximum of 1024 physical columns. This table can be modified for any number of maximum physical columns within a memory.

TABLE I

| Column Mux | Number of IOs/Number of IO address bits | Number of Column address bits |
| --- | --- | --- |
| 4:1 | 256/8 | 2 |
| 8:1 | 128/7 | 3 |
| 16:1 | 64/6 | 4 |
| 32:1 | 32/5 | 5 |

In the above example, if the IO addresses are coded per zone, then a total of only six address bits would be required. With 32 physical columns per zone, five address bits would be required to identify each IO and column within a particular zone, and one address bit would be required to identify whether there was a failure in that zone. Table 2 shows the number of IO and column address bits required for various combinations of column multiplexer options. Again, the table can be modified to support different numbers of physical columns within a zone.

TABLE 2

| Column Mux | Number of IOs in each zone | Number of address bits for IOs | Number of address bits for columns | Total number of bits |
| --- | --- | --- | --- | --- |
| 4:1 | 8 | 3 | 2 | 5 + 1 for repair info |
| 8:1 | 4 | 2 | 3 | 5 + 1 for repair info |
| 16:1 | 2 | 1 | 4 | 5 + 1 for repair info |
| 32:1 | 1 | 0 | 5 | 5 + 1 for repair info |

With an 8:1 column multiplexer, there are four IOs in each zone. With four IOs in each zone, only two address bits are required to identify an IO in any particular zone. With eight columns in each IO, only three address bits are required to identify the column in that IO. Thus, a total of five address bits are required to identify the IO and column, and one address bit is required to identify whether there is a failure in each zone. In one embodiment, each defective column is identified by a digital code value with the above-bit fields, which indicate whether the zone has a defective column, identify the IO containing the defective column and identify the column in the IO that is the defective column. Based on this code value, BISR circuit 14 can determine which latches need to be loaded with new values. During the repair operation, BISR circuit 14 would cycle through each column multiplexer selection to set the latches for each column.

In the embodiment shown in FIG. 3, column select switches M1, redundant column select switches M2 and grounding switches M3 include N-channel transistors. However, any type of switch can be used in alternative embodiments. For example, each switch M1, M2 and M3 can include an n-channel transistor, a p-channel transistor or a combination of both, with appropriate inversions of the respective control signals. Similarly, transmission gates T1 and T2 can include n-channel transistors, p-channel transistors, a combination of n-channel and p-channel transistors or any other type of switch or pass gate.

The column redundancy scheme shown in FIG. 3 can be easily modified to support multiple repairs within each zone 214. For each defect to be repaired, there would be one redundant column 220, one redundant column select switch M2 for each IO, a respective steering path 307, and one column access control latch 310.

Figure 4:
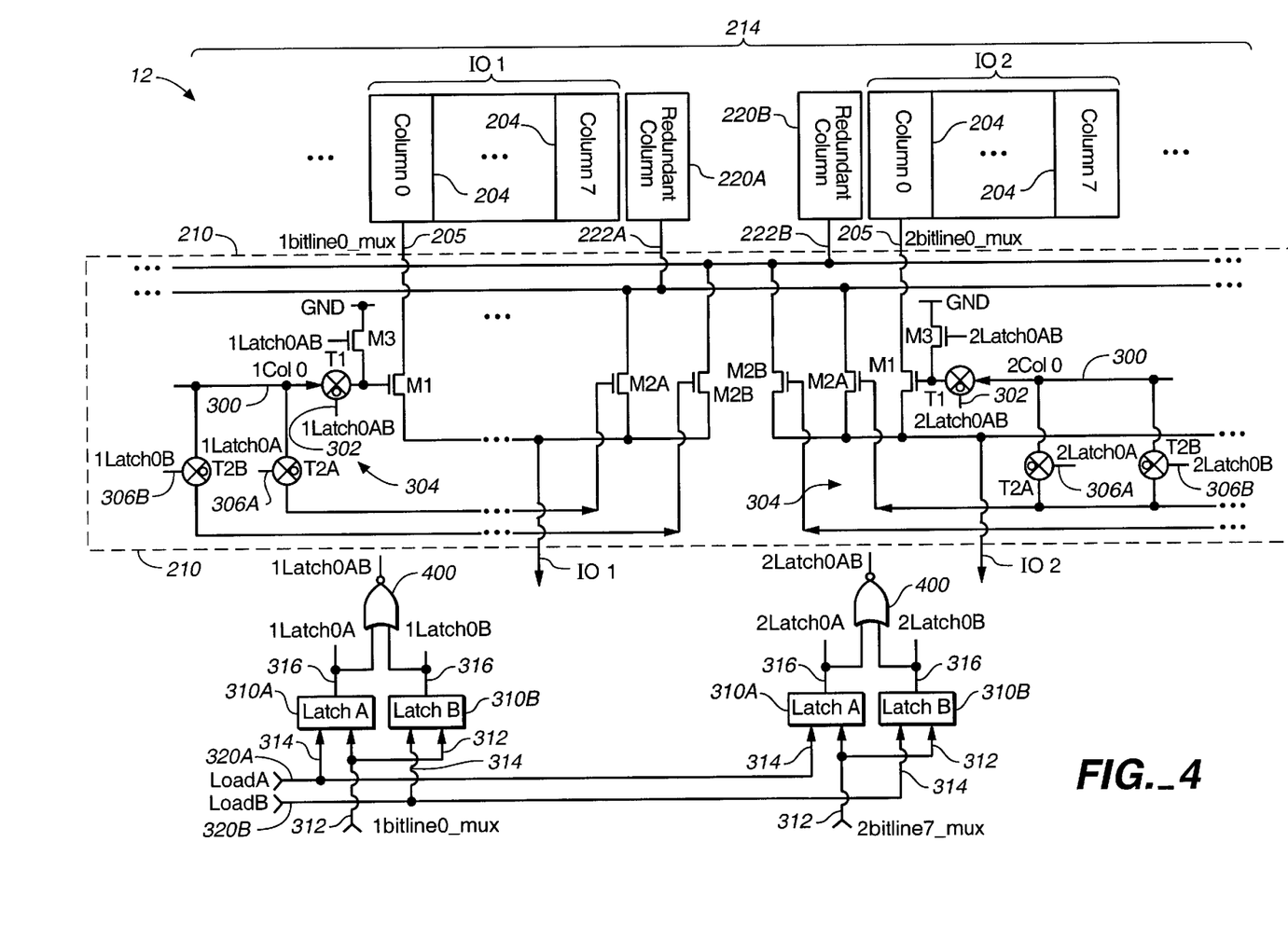
FIG. 4 is a fragmentary, schematic diagram which illustrates an alternative embodiment of the present invention in which the memory is capable of repairing two failures per zone.

FIG. 4 is a schematic diagram of an alternative embodiment of the present invention which supports two repairs per zone. The same reference numerals are used in FIG. 4 as were used in FIG. 3 for the same or similar elements. For simplicity, the figure shows only the column access circuitry for column 0 of IO1 and column 0 of IO2. The column access circuitry for the remaining columns is substantially similar. Each zone 214 of memory array 12 includes redundant columns 220A and 220B, which have bitlines 222A and 222B, respectively. For each IO, redundant bitlines 222A and 222B are coupled to the respective multiplexer input-output node IO1–IO127 through redundant column select switches M2A and M2B, respectively. For each physical column in memory array 12, column multiplexer 210 has a column access steering circuit 304, which includes transmission gates T1, T2A and T2B and grounding switch M3. Transmission gate, T1 selectively couples and decouples column select switch M1 to and from its respective column select line 300. Grounding transistor M3 grounds the control terminal of column select switch M1 when transmission gate T1 is in the off state. Transmission gate T2A is coupled between column select line 300 and redundant column select switch M2A. Transmission gate T2B is coupled between column select line 300 and redundant column select switch M2B.

The switches in each column access steering circuit 304 are controlled by two column access control latches 310A and 310B. Latch 310A is used to selectively replace the corresponding column 204 with redundant column 220A. Latch 310B is used to selectively replace the corresponding column 204 with redundant column 220B. The data output 316 of latch 310A is coupled to the non-inverting control terminal 306A of transmission gate T2A, whereas the data output 316 of latch 310B is coupled to the non-inverting control terminal 306B of transmission gate T2B. The data outputs 316 of latches 310A and 310B are combined through OR gate 400 to control transmission gate T1 and grounding switch M3.

Thus, when either latch 310A or latch 310B contains a "one" transmission gate T1 decouples column access switch M1 from the corresponding column select line 300 and the corresponding transmission gate T2A or T2B couples the column select line 300 to the control terminal of the corresponding redundant column select switch M2A or M2B. Latches 310A and 310B are loaded in a similar fashion as was discussed with reference to FIG. 3. However, each set of latches 310A and 310B is controlled by a separate load control input 320A and 320B. With the circuit shown in FIG. 4, any two of the physical columns in zone 214 can be replaced with redundant columns 220A and 220B by loading the appropriate states into latches 310A and 310B. This redundancy scheme can be expanded to include any number of redundant columns in each zone 214 of memory array 12.

The column redundancy scheme of the present invention ensures that there is no timing penalty associated with the redundancy. Once the latches have been set to their appropriate states, the defective columns are replaced with redundant columns. No additional column address decoding is required to map column addresses from the defective column to the redundant column. Also, there are no additional elements inserted in the data path from each bitline to the respective data input-output node. The only penalty associated with the column redundancy scheme is the area consumed by the redundant columns and the support circuitry. However, the amount of the area penalty can be controlled by selecting the number of redundant columns per zone and the size of each zone. In addition, the column redundancy scheme of the present invention can be configured to repair as many defects as desired within a zone. Since it is generally found that defects occur in pairs, such defect pairs can be easily repaired with the column redundancy scheme of the present invention. The BISR logic required to implement the column redundancy scheme is not very complex, and the total cycle time during power-up that is required to load the latches is very small. Also, with this redundancy scheme, redundant columns can be shared between different IOs within a zone.

It is to be understood that even though numerous characteristics and advantages of various embodiments of the present invention have been set forth in the foregoing description, together with details of the structure and function of various embodiments of the invention, this disclosure is illustrative only, and changes may be made in details, especially in matters of structure and arrangement of parts within the principles of the present invention to the full extent indicated by the broad general meaning of the terms in which the appended claims are expressed. For example, the column redundancy scheme of the present invention has been described with respect to a single-port memory. However, the scheme can be applied to multi-port memories or any other type of memory in which column redundancy can be used. Also, the switches used in the column multiplexer for re-directing the column select lines to the redundant columns can includes any type of switch, and the same or independent, parallel circuitry can be used for write and read operations.

What is claimed is:

1. A memory array comprising:
   a zone of memory elements arranged in rows and columns, including a first set of non-redundant columns and a first redundant column;
   a first data node; and
   a column multiplexer having a first section which is coupled to the first set of non-redundant columns and the first redundant column and comprises:
      a selectable non-redundant path through the first section for each of the non-redundant columns, which extends from a respective one of the non-redundant columns in the first set to the first data node;

a selectable redundant path through the first section, which extends from the first redundant column to the first data node;

a respective column select line for each of the non-redundant paths;

a non-redundant column select switch in each of the non-redundant paths, which comprises a select terminal and is coupled in series between a respective one of the non-redundant columns in the first set and the first data node;

a redundant column select switch in the first redundant path, which comprises a select terminal and is coupled in series between the first redundant column and the first data node; and wherein each of the column select lines is switchably coupled to either the select terminal of the respective non-redundant column select switch or the select terminal of the redundant column select switch such that the redundant path is interchangeable with any one of the non-redundant paths for the non-redundant columns in the first set.

2. The memory array of claim 1 wherein:

each of the non-redundant paths through the first section contains only a single transistor, which forms the respective non-redundant column select switch; and the redundant path through the first section contains only a single transistor, which forms the redundant column select switch.

3. The memory array of claim 1 and further comprising a second data node and wherein:

the zone of memory elements includes a second set of non-redundant columns; and the column multiplexer has a second section which is coupled to the second set of non-redundant columns and the first redundant column and comprises a selectable non-redundant path through the second section for each of the non-redundant columns in the second set, which extends from a respective one of the non-redundant columns in the second set to the second data node and a selectable redundant path through the second section, which extends from the first redundant column to the second data node, wherein the redundant path through the second section is interchangeable with any one of the non-redundant paths through the second section.

4. The memory array of claim 3 wherein:

the zone of memory elements further includes a second redundant column;

the first column multiplexer section is further coupled to the second redundant column and has a selectable redundant path for the second redundant column, wherein the redundant path for the second redundant column in the first section is interchangeable with any one of the non-redundant paths in the first section; and the second column multiplexer section is further coupled to the second redundant column and has a selectable redundant path for the second redundant column, wherein the redundant path for the second redundant column in the second section is interchangeable with any one of the non-redundant paths in the second section.

5. The memory array of claim 1 wherein the first column multiplexer section further comprises a column select steering circuit for each of the non-redundant paths in the first column multiplexer section, wherein each column select steering circuit comprises:

a first switch coupled in series between the respective column select line and the select terminal of the respective non-redundant column select switch; and a second switch coupled in series between the respective column select line and the select terminal of the redundant column select switch.

6. The memory array of claim 5 wherein each column select steering circuit further comprises:

a third switch coupled in series between the select terminal of the respective non-redundant column select switch and a voltage reference terminal.

7. The memory array of claim 5 wherein each column select steering circuit further comprises:

a respective latch having a data output coupled to the switch control terminals of the first and second switches.

8. A memory system for replacing defective memory elements, the memory system comprising:

a memory array including a zone of memory elements arranged in rows and columns, including a first set of non-redundant columns and a first redundant column; and column multiplexer means having a first section for multiplexing the first set of non-redundant columns into a first data node through respective, selectable non-redundant paths which extend from a respective one of the non-redundant columns in the first set to the first data node through a respective single non-redundant column select transistor and for selectively interchanging a selectable redundant path for any one of the non-redundant paths, which extends from the first redundant column to the first data node through a respective single redundant column select transistor.

9. The memory array of claim 8 wherein:

the zone of memory elements includes a second set of non-redundant columns; and the column multiplexer means further comprises a second section having a selectable non-redundant path from each of the non-redundant columns in the second set to a second data node and a selectable redundant path from the first redundant column to the second data node, wherein the redundant path in the second section is interchangeable with any one of the non-redundant paths in the second section.

10. The memory array of claim 9 wherein:

the zone of memory elements further includes a second redundant column;

the first column multiplexer section further comprises a selectable redundant path from the second redundant column to the first data node, wherein the redundant path for the second redundant column in the first section is interchangeable with any one of the non-redundant paths in the first section; and the second column multiplexer section further comprises a selectable redundant path from the second redundant column to the second data node, wherein the redundant path for the second redundant column in the second section is interchangeable with any one of the non-redundant paths in the second section.

11. The memory array of claim 8 wherein the first section of the column multiplexer means comprises a respective column select line for each of the non-redundant paths and wherein:

each of the non-redundant column select transistors comprises a select terminal and is coupled in series between a respective one of the non-redundant columns in the first set and the first data node;

the redundant column select transistor comprises a select terminal and is coupled in series between the first redundant column and the first data node; and each of the column select lines is switchably coupled to either the select terminal of the respective non-redundant column select transistor or the select terminal of the redundant column select transistor.

12. The memory array of claim 11 wherein the first section of the column multiplexer means further comprises a column select steering circuit for each of the non-redundant paths in the first section, wherein each column select steering circuit comprises:

a first switch coupled in series between the respective column select line and the select terminal of the respective non-redundant column select transistor; and a second switch coupled in series between the respective column select line and the select terminal of the redundant column select transistor.

13. The memory array of claim 12 wherein each column select steering circuit further comprises:

a third switch coupled in series between the select terminal of the respective non-redundant column select transistor and a voltage reference terminal.

14. The memory array of claim 12 wherein each column select steering circuit further comprises:

a respective latch having a data output coupled to the switch control terminals of the first and second switches.

15. A method of repairing a memory array having a zone of memory elements arranged in rows and columns, including a first set of non-redundant columns, and a column multiplexer having a non-redundant path from each non-redundant column to a first data node, which is selectable through a corresponding column select line, the method comprising:

(a) providing a first redundant column of memory elements in the zone and a redundant path from the first redundant column to the first data node through the column multiplexer;

(b) identifying one of the non-redundant columns as a defective column; and (c) re-directing the column select line that corresponds to the non-redundant path for the defective column from the corresponding non-redundant path to the redundant path.

* * * * *